United States Patent [19]

Kushida et al.

[11] Patent Number: 4,692,653
[45] Date of Patent: Sep. 8, 1987

[54] ACOUSTIC TRANSDUCERS UTILIZING ZNO THIN FILM

[75] Inventors: Keiko Kushida, Kunitachi; Hiroshi Takeuchi, Matsudo; Kageyoshi Katakura, Tokyo, all of Japan

[73] Assignee: Hitachi, Ltd., Tokyo, Japan

[21] Appl. No.: 712,852

[22] Filed: Mar. 18, 1985

[30] Foreign Application Priority Data

Mar. 23, 1984 [JP] Japan .................................. 59-55756
Jul. 6, 1984 [JP] Japan ................................ 59-139004
Jul. 9, 1984 [JP] Japan ................................ 59-141745

[51] Int. Cl.[4] .......................................... H01L 41/08
[52] U.S. Cl. .................................... 310/334; 310/364; 310/365
[58] Field of Search ............... 310/324, 334, 364, 365, 310/366, 322, 325; 333/141; 357/26

[56] References Cited

U.S. PATENT DOCUMENTS 3,846,649 11/1974 Lehmann et al. ............... 310/334 X
4,339,683 7/1982 Scott et al. .......................... 310/364

Primary Examiner—Patrick R. Salce
Assistant Examiner—Emanuel Todd Voeltz
Attorney, Agent, or Firm—Antonelli, Terry & Wands

[57] ABSTRACT

In an acoustic transducer comprising a lower electrode, a zinc oxide (ZnO) film, which is a piezo-electrically active body, and at least one upper electrode superposed one after another on a substrate, the lower electrode consists of at least one gold polycrystalline film deposited by evaporation, interposing a thin chromium film, on the substrate and crystallites of the gold polycrystalline film are so oriented that the standard deviation of the locking curve for the (111) diffraction beam is smaller than 3°. In order to obtain a gold film having such a good orientation, the thickness of the chromium film is limited to 20 nm at largest. The zinc oxide film thus superposed on the lower electrode thus composed is excellent in c-axis orientation and thus permits to obtain a high electro-mechanical coupling factor efficiency of the acoustic transducer.

8 Claims, 14 Drawing Figures

ACOUSTIC TRANSDUCERS UTILIZING ZNO THIN FILM

BACKGROUND OF THE INVENTION

This invention relates to acoustic transducers for generation, detection, etc. of ultrasonic waves, in particular to ultrasonic transducers utilizing a zinc oxide (ZnO) thin film as a piezo-electric material.

Zinc oxide (ZnO) is widely utilized in high frequency ultrasonic transducers, because its electromechanical coupling coefficient of the longitudinal oscillation in the direction of the thickness is for bulk as large as 0.30 and thin films thereof can be fabricated relatively easily. They are fabricated by chemical vapor deposition (CVD), sputtering methods, etc. The sputtering methods are predominantly utilized. Among the sputtering methods various thin film formation methods are known, such as direct current sputtering, high frequency sputtering, sputtering with zinc oxide target, reactive sputtering by which sputtering is effected in an oxygen atmosphere by using a zinc plate as a target. However, by any method, deterioration of characteristics due to formation in thin film is inevitable.

By these methods, polycrystalline zinc oxide films are formed on amorphous substrates with c-axis orientation. In this case, zinc oxide films, which are better in crystallinity and c-axis orientation with respect to the substrate, have larger electro-mechanical coupling factors. Consequently it is important to form zinc oxide thin films, with high crystallinity and c-axis orientation. A number of studies are performed in order to obtain optimum formation conditions with this respect.

On the other hand, for constructing a piezo-electric element, a pair of electrodes for applying a voltage thereon are necessary and gold Au, which is excellent in conductivity and stability, is most widely utilized as electrode material therefor. However, since adhesion strength of a gold film deposited directly on a substrate of quartz glass, etc. is small, a layer of chromium Cr, titanium Ti, aluminium Al, etc. is needed to make the gold film stick to the substrate.

It has been already discussed in an article entitled "ZnO Acoustic Transducers Utilizing Crystalline Gold Substrate" by R. Wagers, G. Kino, et al., Proc. IEEE Ultrasonics Symposium 194 (1972) that the sensitivity of zinc oxide thin film ultrasonic transducers utilizing gold as electrode material depends on properties of the gold film. However, formation conditions for the gold film, which is required for constructing an ultrasonic transducer having a high electro-mechanical coupling factor, have not yet quantitatively been well known.

SUMMARY OF THE INVENTION

The first object of this invention is to determine the conditions on the property of a gold film for providing a piezo-electric transducer, which has a high electro-mechanical coupling factor.

Another object is to determine the condition for forming the gold film with a high reproducibility.

Another object of this invention is to provide an acoustic transducer ameliorated in shape of the emitted acoustic wave by controlling locally the crystalline properties of a piezo-electric film.

Still another object of this invention is to provide a multi-element type acoustic transducer by controlling locally the crystalline properties of the piezo-electric film.

In order to achieve these objects an acoustic transducer according to this invention is characterized in that, in a piezo-electric element having a gold electrode film formed on a substrate, a zinc oxide thin film formed by high frequency sputtering on the gold electrode film, and an upper electrode formed on the zinc oxide thin film, the standard deviation of the rocking curve for the (111) diffraction peak by the gold electrode film is smaller than 3°.

Further, the practical construction of the acoustic transducer according to this invention is characterized in that a chromium film is interposed between the gold electrode film and the substrate in order to increase the adhesion of the gold electrode film, and that the thickness of the chronium film is smaller than 30 nm.

Still other features of this invention will be clarified by the following concrete explanation.

DESCRIPTION OF THE PREFERRED EMBODIMENT

Figure 1:
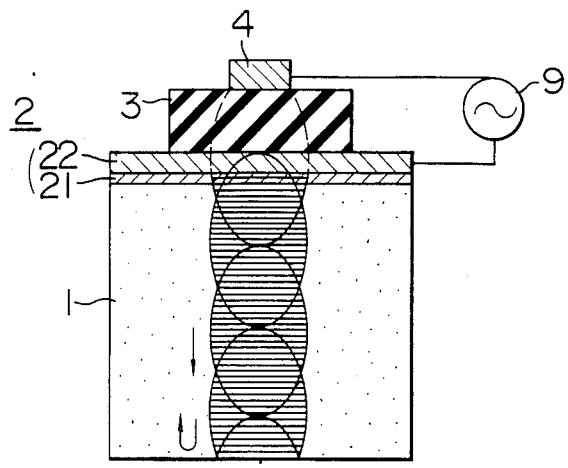
FIG. 1 is a cross-sectional view for explaining the acoustic transducer according to this invention and the working mode thereof.
Figure 2:
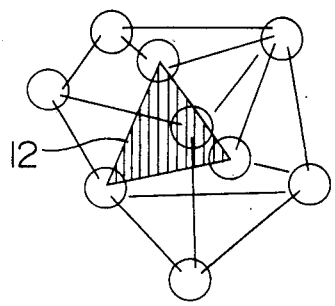
FIG. 2 is a diagram illustrating the orientation of a gold polycrystalline film.

FIG. 1 illustrates a method for measuring the reflected echo intensity according to this invention and FIG. 2 is a diagram illustrating the orientation of a gold polycrystalline film used for the lower electrode of this invention.

The inventors of this invention paid his attention to the fact that the lower electrode 2, which is formed on a rod (substrate) 1 and on which a zinc oxide thin film 3 is formed, has remarkable influences on electro-mechanical properties of the piezo-electric element and carried out the following experiments. As the result, it was possible to obtain a piezo-electric element having high efficiency by defining the orientation of the gold electrode film. In fact, results of experiments have shown that the electro-mechanical coupling factor of the zinc oxide thin film formed on the gold electrode film depend strongly on the standard deviation $\sigma$ of the Au (111) rocking curve representing the deviation of the orientation of the gold polycrystalline film. Now some examples of the experiments will be described.

Both the end surfaces of a quartz glass rod 1 (10 mm diameter×10 mm length) are mirror-polished. The lower electrode 2 is formed by depositing a chromium (Cr) film 21 and then a gold (Au) film 22 by evaporation at 220° C. on one of the surfaces. This Cr film 21 is disposed for the purpose of increasing the adhesion of the Au film 22. A zinc oxide thin film 3, which is about 4 μm thick, is formed by high frequency magnetron sputtering on the electrode 2. The sputtering is effected under the conditions that the temperature of the substrate is 220° C. and the pressure of the mixture gas of argon (Ar)-oxygen ($O_2$) (50%-50%) is 3 Pa.

Samples thus fabricated were evaluated by X-ray diffraction and diffraction peaks of ZnO (002) and (004) and Au (111) were found. In addition rocking curves for the Au (111) diffraction peak were measured and their standard deviation was calculated.

On this zinc oxide thin film a chromium (Cr) film and a gold (Au) film are successively deposited by evaporation at room temperature through a hole of 3 mm diameter formed in a molybdenum mask in order to form an upper electrode 4.

Gold has a structure as shown in FIG. 2 and when it is deposited on a substrate 1, it is so oriented that the orientation of a plane 12 denoted by 111 is perpendicular to the surface of the substrate 1. However, among the crystallites of the gold polycrystalline film deposited by evaporation on the substrate 1, there exist those whose orientation of the plane 12 is not perpendicular to the surface of the substrate, but deviates slightly therefrom in any direction. The rocking curve for the Au (111) diffraction peak gives a measure for the deviation of this orientation of the plane 12 from the perpendicular direction.

Figure 3:
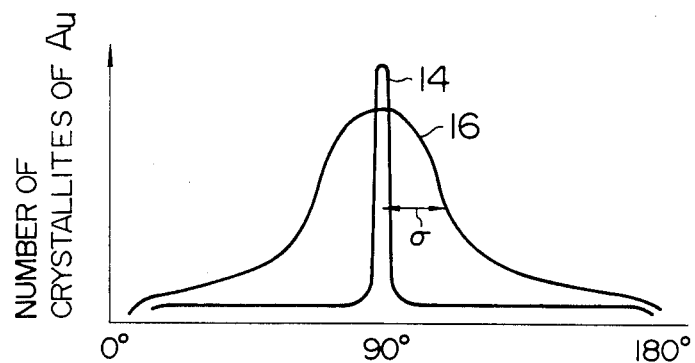
FIG. 3 shows a locking curve of the Au (111) diffraction peak.

FIG. 3 shows a rocking curve for the Au (111) diffraction peak. In this figure, the abscissa represents the angle showing the deviation of this plane and the ordinate indicates the number of crystallitess of gold. A gold polycrystalline film giving a curve, which rises abruptly at 90°, as indicated by a curve 14, is the most excellent. To the contrary, a curve 16 which is broader indicates that the plane is not uniformly directed, but fluctuations of its direction are great. That is, the standard deviation representing the broadness of the curve indicates the degree of the fluctuations.

When a pulse voltage with a frequency of 0.2-1.2 GHz is applied between the two electrodes 2 and 4 of the ultrasonic transducer shown in FIG. 1, the zinc oxide thin film 3 vibrates longitudinally. Thus a vibration wave (ultrasonic wave) propagates in the quartz glass rod 1 through the lower electrode 2. The wave is reflected at the lower end and returns to the zinc oxide thin film 3. In this case there is a time delay between the emitted wave and the reflected wave in the quartz glass rod 1.

Figure 4:
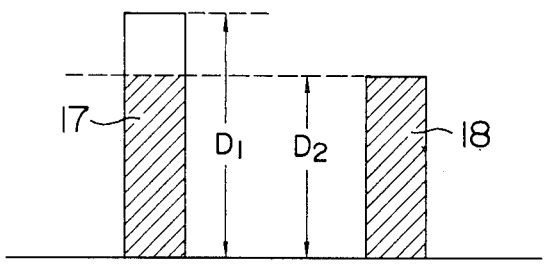
FIG. 4 is a conceptional diagram illustrating a method for measuring the sensitivity of the acoustic transducer.

In the experiment the intensity of the echo is measured. FIG. 4 is a diagram showing measured values of the amplitude of the emitted wave and the reflected wave.

Now the amplitude of the emitted vibration wave 17 and that of the reflected vibration wave 18 are denoted by $D_1$ and $D_2$, respectively, as indicated in FIG. 4. The amplitude ratio $D_2/D_1$ is expressed in dB and the sensitivity of the zinc oxide thin film ultrasonic transducer is defined by this value.

Figure 5:
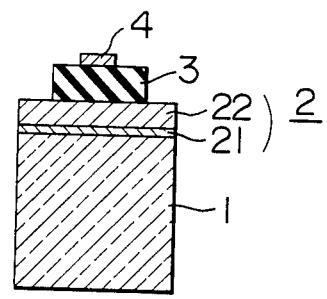
FIG. 5 is a cross-sectional view of an embodiment of acoustic transducers according to this invention.
Figure 6:
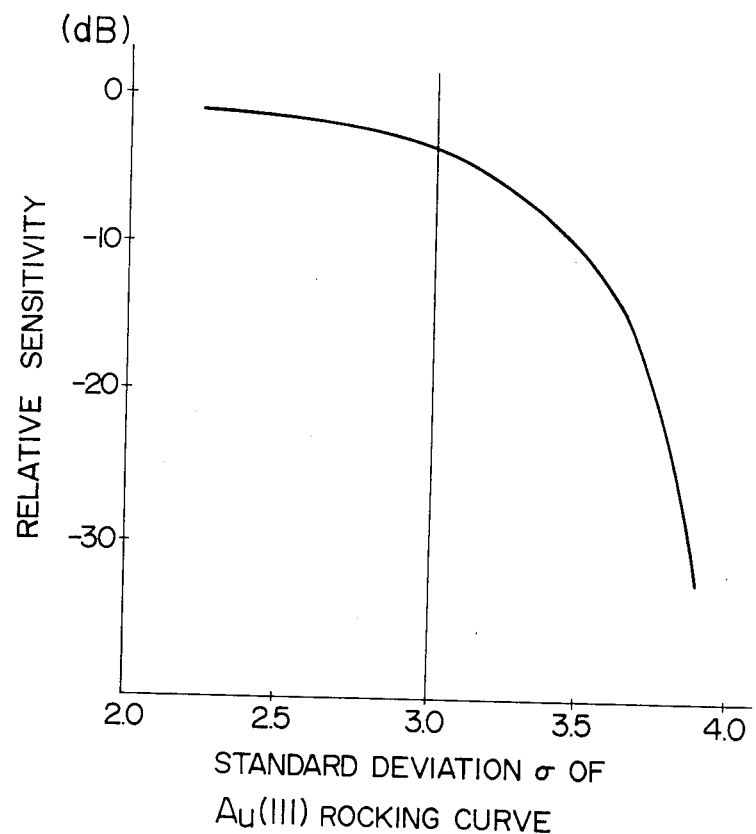
FIGS. 6 to 8 are diagrams showing characteristics of the acoustic transducers for various parameters.
Figure 7:
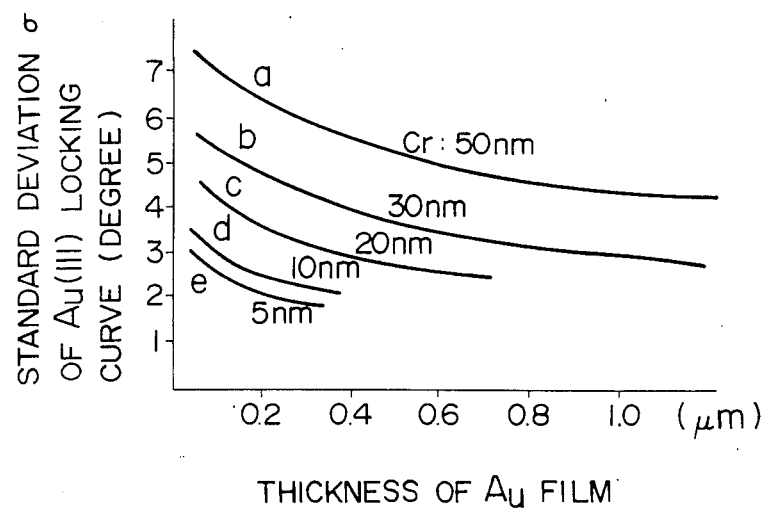

FIG. 5 is a cross-sectional view of a piezo-electric element fabricated according to this invention and FIG. 6 shows a curve representing the relation between the standard deviation $\sigma$ of the Au (111) rocking curve and the sensitivity of the zinc oxide ultrasonic transducer.

In FIG. 5, the reference numeral 1 designates the quartz glass rod; 2 represents the lower electrode consisting of the chrome film 21 and the gold film 22; 3 is the zinc oxide thin film; and 4 is the upper electrode. For the lower electrode 2 a gold thin film having the properties chosen according to this invention is used, but for the upper electrode 4, besides gold (Au), aluminium (Al) etc. may be used.

The abscissa in FIG. 6 represents the standard deviation $\sigma$ (unit: degree) for the Au (111) locking curve and the ordinate indicates the relative sensitivity (unit: dB) of the zinc oxide acoustic transducer.

The relative sensitivity, which is the sensitivity (in dB) measured by the pulse echo method mentioned above, is not $D_2/D_1$ (in dB) indicated in FIG. 4, but the relative sensitivity for a plurality of acoustic transducers.

As it is clear from the curve indicated in FIG. 6. The sensitivity of the zinc oxide thin film depends remarkably on the standard deviation $\sigma$ of the Au (111) rocking curve for the lower electrode. When $\sigma$ is smaller than 3°, it is possible to obtain a satisfactorily high sensitivity and when it exceeds 3°, the sensitivity decreases rapidly. Consequently an acoustic transducer having high electro-mechanical coupling factor can be realized by forming a zinc oxide film on a gold film 22, whose $\sigma$ is smaller than 3°.

Fabrication steps for obtaining an acoustic transducer in practice in accordance with the conditions described above are as follows.

At first a chromium (Cr) film and then a gold (Au) film are deposited by evaporation on a surface of each of quartz glass rods 1. Thereafter a locking curve is measured by X-ray diffraction for each of them, and thus those having a standard deviation $\sigma$ smaller than 3° for the gold film are selected. A zinc oxide (ZnO) film is formed by sputtering on the gold film of each of those thus selected. Finally an upper electrode is disposed thereon and thus a piezo-electric element is obtained. In addition, since the greater the thickness of the gold film is, the smaller the value of the standard deviation $\sigma$ is, in the case where a desired value of $\sigma$ cannot be obtained, when the locking curve is measured by X-ray diffraction, gold may be again deposited by evaporation on the quartz glass rod 1 so that the film formed by evaporation becomes thicker.

Next, a number of samples were prepared by varying the thickness of the chromium film 21 and that of the gold film 22 and $\sigma$ of the Au (111) locking curve was measured for each of them. When the thickness of the chromium film t (Cr)=50 nm (curve a), $\sigma$ exceeds 4° even for the thickness of the gold film 22 greater than 1 μm and therefore it is not suitable as the electrode for the zinc oxide thin film transducer. For t (Cr)=30 nm (curve b), it is possible to obtain $\sigma$ smaller than 3°, when the thickness of the gold film is greater than 1 μm. For t (Cr)<20 nm (curve c, d, e), $\sigma$<3°, even if the gold film 22 is relatively thin. Consequently it is easy to obtain gold films having satisfactorily good orientation. In particular, for t (Cr)=10 nm (curve d) the thickness of the gold film 22 may be approximately 0.1 μm and thus it is very practical. In this way it is possible to obtain a gold film having an excellent orientation even for a film thickness smaller than about 1 μm by forming the gold film on a chromium film thinner than 30 nm. Consequently, it is clear that by constructing a transducer with a zinc oxide thin film disposed on this electrode thus formed, a stable and relatively cheap piezo-electric element having a high electro-mechanical coupling factor can be fabricated. In particular, it is also obvious that it is easy to obtain a gold film having an excellent orientation, when the chromium film is thinner than 10 nm.

Figure 8:
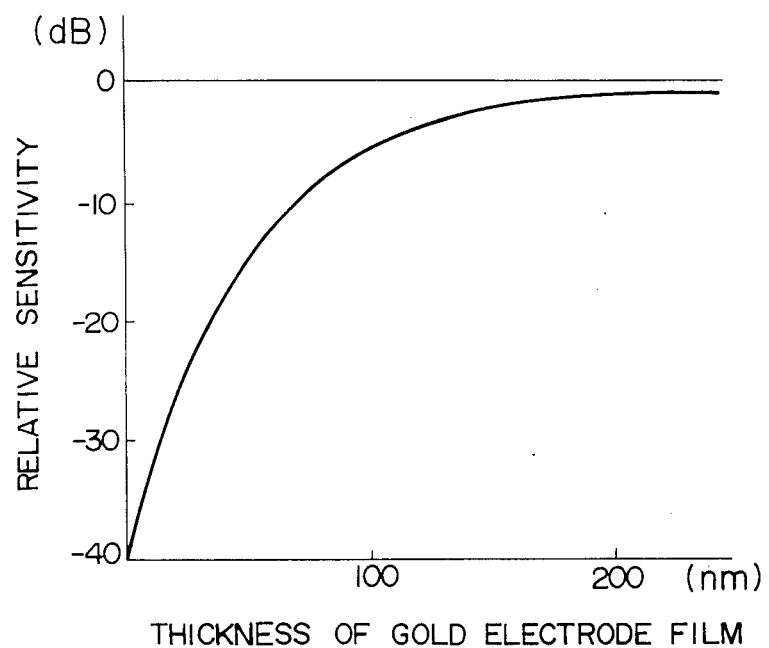

After that, a number of samples were prepared with a constant thickness of the chromium film 21 by varying the thickness of the gold film 22 and the dependence of the sensitivity of the transducer on the thickness of the gold film was studied. The curve in FIG. 8 represents the dependence of the relative sensitivity on the thickness of the gold film for a thickness of 10 nm of the chromium film. When the thickness of the gold film is greater than 100 nm, it has almost no influences on the sensitivity, but when it becomes smaller than this value, the sensitivity decreases rapidly. In addition, when the zinc oxide film 3 is formed directly on the chromium film 21, the sensitivity is still lower. It is believed this can be attributed to the fact that the crystal of chromium (Cr) is the body centered cubic and that when a chromium film is deposited by evaporation on a substrate, a polycrystalline film having crystal axes oriented at random with respect to the surface of the substrate is formed so that it cannot be matched structurally with zinc oxide (ZnO). Consequently, by utilizing this property, it is possible to fabricate various acoustic transducers, in which the piezo-electric activity of the zinc oxide film disposed on the gold film varies positionally by varying positionally the thickness of the gold film or by forming only partially the gold film.

Figure 9:
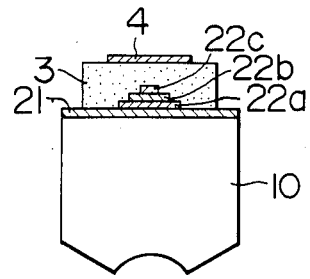
FIGS. 9 and 10 are a cross-sectional view of another embodiment according to this invention and a curve showing the beam characteristics therefor, respectively.
Figure 10:
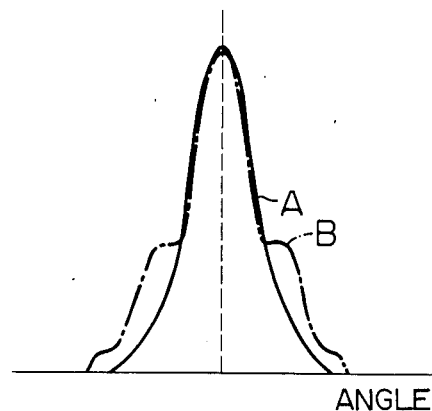

FIG. 9 shows an embodiment of acoustic transducers with acoustic lens used for the ultrasonic microscope. An end surface of a quartz glass rod 10 is formed in a concave semispherical shape so that the quartz glass rod 10 can serve as a lens for focussing acoustic waves. The other end surface is optically polished and a chromium film 21 is formed on the polished surface. Then gold films 22a, 22b and 22c, which are about 30, 30 and 40 nm thick, respectively, are formed successively on each another by evaporation so that higher one has a smaller diameter, as indicated in FIG. 9. By using this as a substrate a zinc oxide thin film 3 about 4 μm thick is formed by high frequency magnetron sputtering. Further the upper electrode 4 is formed thereon by evaporation. The acoustic wave beam emitted by the transducer was measured. The result of the measurement indicated that the beam had no side lobe and a Gaussian type distribution, as illustrated by the full line A in FIG. 10. This can be attributed to the fact that the gold film in the lower electrode becomes thicker with decreasing distance from the center and that the distribution of the piezoelectric activity of the zinc oxide film 3 is accordingly so determined that the sensitivity of the transducer becomes higher with decreasing distance from the center. Ideally the thickness of the gold film is so distributed that the sensitivity distribution of the transducer is Gaussian. The chain-dotted line B in FIG. 10 represents the shape of the beam emitted by an acoustic transducer having a uniform gold film in the lower electrode for the comparison with the embodiment described above. By the comparison of A and B it can be clearly understood that the side lobe prevention effect can be obtained by the distribution of the thickness of the gold film. It was confirmed that, by using an acoustic transducer without side lobe as indicated in FIG. 9 in an acoustic microscope, a clear image with weak noise can be obtained.

Figure 11A:
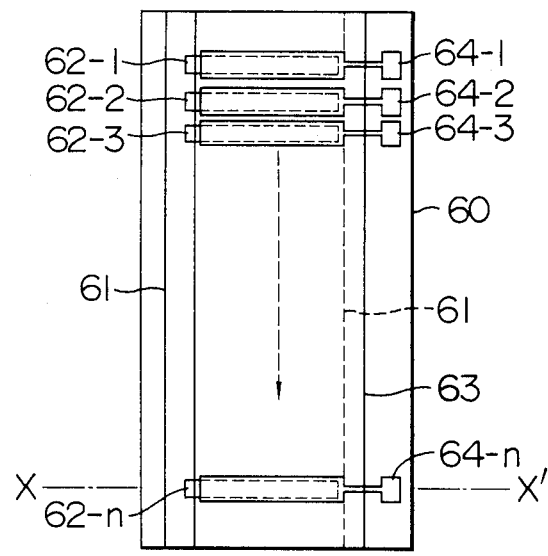
FIGS. 11A and 11B as well as FIGS. 12A and 12B are plan views and cross-sectional views, respectively, of still other embodiments according to this invention.
Figure 11B:
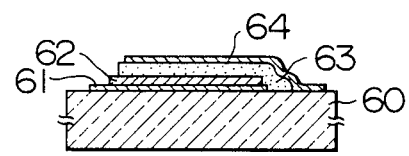

FIG. 11A is a plan view of a linear type multielement acoustic transducer utilizing the piezo-electric inactivity of the zinc oxide film disposed directly on the chromium film for isolation of different elements and FIG. 11B represents a cross-sectional view along the line X-X' in FIG. 11A. In these figures the reference numeral 60 designates a substrate; 61 is a chromium film; 62, 62-1, —, 62-n are gold films (lower electrode); 63 is a zinc oxide thin film; and 64, 64-1, —, 64-n are upper electrodes.

A surface of a substrate 60 (width 5 mm × length 10 mm) is optically polished and a chromium film 61 and a gold film are successively deposited by evaporation thereon. Lower electrodes 62-1, —, 62-n having a pattern as indicated in FIG. 11A were formed by the photolithography method starting from the gold film. By using this as a substrate, a zinc oxide thin film 63 about 4 μm thick is formed by high frequency magnetron sputtering. Further upper electrodes 64-1, —, 64-n are formed thereon at the regions which are over the lower electrodes 62-1, —, 62-n and thus a ultrasonic transducer having an array structure is obtained. In this state, a certain number of elements are driven in a manner that they are successively switched so as to emit acoustic waves while measuring the emitted beams. Thus it was confirmed that a beam having a sharp distribution can displace in the direction of the arrangement of the elements. This is due to the fact that between two adjacent gold films in the lower electrode 62 the zinc oxide thin film 63 is disposed directly on the chromium film 61 and piezo-electrically inactive so that each element can be driven independently from the others. In this way it is also possible to change the target position of the beam by driving the elements with varying electrical phase quantity given to each of the elements.

Figure 12A:
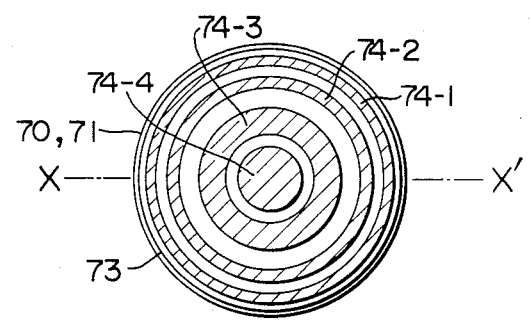
Figure 12B:
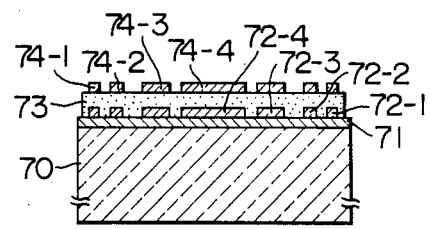

FIG. 12A is a plan view of a multi-element type transducer having a multiple ring structure, which is still another embodiment of this invention, and FIG. 12B represents a cross-sectional view along the line X-X' in FIG. 12A. In these figures the reference numeral 70 designates a substrate; 71 is a chromium film; 72, 72-1, —, 72-4 are gold films (lower electrodes); 73 is a zinc oxide thin film; and 74, 74-1, —, 74-n are upper electrodes.

The transducer indicated in FIGS. 12A and 12B can be fabricated in a manner almost identical to that described for the embodiment indicated in FIGS. 11A and 11B. That is, both the surfaces of a quartz glass plate 5 mm diameter × 5 m length serving as a substrate 70 are optically polished and a chromium film 71 and a gold film are successively deposited by evaporation thereon. Lower electrodes 72-1, —, 72-4 having a multiple ring-shaped pattern as indicated in FIG. 12A are formed by the photolithography method starting from the gold film. By using this as a substrate, a zinc oxide thin film 73 about 4 μm thick is formed by high frequency magnetron sputtering. Further upper electrodes 74-1, —, 74-4 are formed thereon at the regions which are over the lower electrodes 72-1, —, 72-4 and thus a ultrasonic transducer having a multiple ring structure is fabricated. In this state, each of the ring-shaped elements is driven independently from the other so as to emit acoustic waves in such a manner that an element closer to the center is driven with more retarded phase. The emitted beam was measured and it was recognized that a well focussed beam having a beam pattern which was almost identical to that obtained by theoretical calculation.

As explained above, in a multi-element type transducer having a structure by which the gold film serving as the lower electrode is formed only at the regions where the elements should be constructed, leaving the chronium film exposed at the other regions and the zinc oxide film is superposed thereon, since the zinc oxide film is piezo-electrically inactive at the regions which are not covered by the elements, it is possible to obtain easily a multi-element transducer which is excellent in isolation between different elements.

We claim:

1. In a piezo-electric transducer comprising a first electrode film formed on a substrate, a zinc oxide thin film formed by high frequency sputtering on said first electrode film and at least one second electrode film formed on said zinc oxide thin film, the improvement wherein said first electrode film is a gold film, for which the standard deviation of the rocking curve for the (111) diffraction peak is smaller than 3° is used.

2. In an acoustic transducer comprising a first electrode consisting of a chromium film formed on a substrate and a gold film superposed thereon, a zinc oxide thin film formed by high frequency sputtering on said first electrode and at least one second electrode formed on said zinc oxide thin film, the improvement wherein the thickness of said chromium film is smaller than 30 nm, wherein the thickness of said gold film varies positionally so that the piezoelectric activity of said zinc oxide thin film varies positionally depending on the thickness of said gold film.

3. Acoustic transducer according to claim 2, wherein the thickness of said gold film is greater at the central portion than at the peripheral portion.

4. Acoustic transducer according to claim 3, wherein the positional distribution of the sensitivity of the transducer is Gaussian, depending on the distribution of the thickness of said gold film.

5. Acoustic transducer according to claim 2, wherein said gold film is formed only at regions which are to be used as tranducer elements and at the remaining regions said zinc oxide film is superposed directly on said chromium film.

6. Multi-element type acoustic transducer comprising:
- a first electrode consisting of a chromium film formed on a substrate and gold films superposed thereon;
- a zinc oxide thin film formed by high frequency sputtering on said first electrode;
- a plurality of second electrodes formed separately from each other at a plurality of regions on said zinc oxide film, thus constituting separate piezoelectric elements, said gold films being also divided into a plurality of regions corresponding to said piezo-electric elements.

7. In an acoustic transducer comprising a first electrode comprised of a chromium film formed on a substrate and a gold film superposed thereon, a zinc oxide thin film formed by high frequency sputtering on said first electrode and at least one second electrode formed on said zinc oxide thin film, the improvement wherein the thickness of said chromium film is smaller than 30 nm, wherein the thickness of said gold film varies positionally, wherein the thickness of said gold film is greater at the central portion than at the peripheral portion, and wherein the positional distribution of the sensitivity of the transducer is Gaussian, depending on the distribution of the thickness of said gold film.

8. In an acoustic transducer comprising a first electrode comprised of a chromium film formed on a substrate and a gold film superposed thereon, a zinc oxide thin film formed by high frequency sputtering on said first electrode and at least one second electrode formed on said zinc oxide thin film, the improvement wherein the thickness of said chromium film is smaller than 30 nm, wherein the thickness of said gold film varies positionally, and wherein said gold film is formed only at regions which are to be used as transducer elements and at the remaining regions said zinc oxide film is superposed directly on said chromium film.

* * * * *